(12) United States Patent
Lee (10) Patent No.: US 10,692,902 B2
(45) Date of Patent: Jun. 23, 2020

(54) IMAGE SENSING DEVICE AND IMAGE SENSING METHOD

(71) Applicant: Eagle Vision Tech Limited., Taipei (TW)

(72) Inventor: Sywe-Neng Lee, Taipei (TW)

(73) Assignee: Eagle Vision Tech Limited., Taipei (TW)

( * ) Notice: Subject to any disclaimer, the term of this patent is extended or adjusted under 35 U.S.C. 154(b) by 0 days.

(21) Appl. No.: 16/005,702

(22) Filed: Jun. 12, 2018

(65) Prior Publication Data

US 2019/0006400 A1 Jan. 3, 2019

(30) Foreign Application Priority Data

Jun. 30, 2017 (TW) .............................. 106122032 A (51) Int. Cl.
| | | |
|---|---|---|
| *H04N 5/378* | (2011.01) | |
| *H04N 5/232* | (2006.01) | |
| *H04N 5/374* | (2011.01) | |
| *H04N 5/225* | (2006.01) | |
| *H01L 27/146* | (2006.01) | |

(Continued)

(52) U.S. Cl.
CPC ..... *H01L 27/14603* (2013.01); *H04N 5/2258* (2013.01); *H04N 5/23229* (2013.01); *H04N 5/23232* (2013.01); *H04N 5/378* (2013.01); *H04N 5/379* (2018.08); *H04N 7/18* (2013.01);
(Continued)

(58) Field of Classification Search
CPC .. H04N 7/08; H04N 5/23229; H04N 5/23232; H04N 5/23296; H04N 5/378; H04N 5/379; H04N 5/37452; H04N 5/2258; H04N 19/40; H01L 27/14603;
(Continued)

(56) References Cited

U.S. PATENT DOCUMENTS 5,043,803 A * 8/1991 Asaida ..................... H04N 9/41
358/41
6,829,012 B2 12/2004 Tarnoff et al.
(Continued)

FOREIGN PATENT DOCUMENTS

KR 101695275 1/2017

OTHER PUBLICATIONS

"Office Action of Taiwan Counterpart Application," dated Jul. 4, 2018, pp. 1-8.

*Primary Examiner* — Marly S Camargo
(74) *Attorney, Agent, or Firm* — JCIPRNET (57) ABSTRACT

An image sensing device and an image sensing method are provided. The image sensing device includes an image sensing array, multiple first signal converters, and multiple first image processing apparatuses. The image sensing array is partitioned into at least two or more first pixel capturing areas, and each of the first pixel capturing areas is compliant with a resolution of an SDTV format. Each of the first signal converters receives an analog image signal from a corresponding first pixel capturing area, converts the analog image signal from an analog format to a digital format to generate a first digital image signal, and converts the first digital image signal from a parallel format to a serial format. Each of the image processing apparatuses is configured to convert the first digital image signal in the serial format of a corresponding first signal converter to a video signal in a specific video format.

17 Claims, 7 Drawing Sheets

(51) Int. Cl.
    *H03M 1/10*     (2006.01)
    *H03M 1/66*     (2006.01)
    *H04N 19/40*     (2014.01)
    *H04N 7/18*     (2006.01)
    *H04N 5/369*     (2011.01)
    *H04N 9/04*     (2006.01)

(52) U.S. Cl.
    CPC ............. *H04N 7/183* (2013.01); *H04N 9/045* (2013.01); *H04N 19/40* (2014.11)

(58) Field of Classification Search
    CPC ......... H01L 27/14609; H01L 27/14625; H01L 27/146; H03M 1/1014; H03M 1/66
    USPC ........... 348/308, 294, 262, 264, 36–39, 159; 250/208.1, 214 DC; 257/291, 292, 258, 257/241, 266, 287, 443; 341/100, 101, 341/110, 146, 162
    See application file for complete search history.

(56) References Cited

U.S. PATENT DOCUMENTS

| | | | | |
|---|---|---|---|---|
| 8,421,891 B2* | 4/2013 | Morikawa | ............... | H04N 5/335 348/294 |
| 8,767,106 B2* | 7/2014 | Ueno | ............... | H04N 5/378 348/300 |
| 2005/0253942 A1* | 11/2005 | Muramatsu | ............ | H04N 9/085 348/273 |
| 2007/0076107 A1* | 4/2007 | Nishimura | ............... | H04N 3/14 348/294 |
| 2007/0160139 A1* | 7/2007 | Vasquez | ................... | H04N 7/12 375/240.08 |
| 2007/0194962 A1* | 8/2007 | Asayama | ........... | H03M 1/1014 341/144 |
| 2008/0211951 A1* | 9/2008 | Wakabayashi | ....... | H04N 5/3655 348/294 |
| 2010/0245627 A1* | 9/2010 | Mellot | ..................... | H04N 5/76 348/231.99 |
| 2010/0276572 A1* | 11/2010 | Iwabuchi | ................ | H01L 25/18 250/208.1 |
| 2012/0026363 A1* | 2/2012 | Fujimura | ............... | H04N 5/378 348/309 |
| 2013/0112852 A1* | 8/2013 | Kizuna | ................... | H04N 5/378 250/208.1 |
| 2013/0250148 A1* | 9/2013 | Park | ....................... | H04N 5/217 348/241 |
| 2013/0250150 A1* | 9/2013 | Malone | .................. | G02B 15/00 348/262 |
| 2014/0232861 A1* | 4/2014 | Naidoo | .................... | H04N 7/18 348/43 |
| 2015/0014516 A1* | 1/2015 | Fukushima | ......... | H03M 1/1014 250/208.1 |
| 2017/0040371 A1* | 2/2017 | Izuhara | ............. | H01L 27/14634 250/206 |
| 2019/0252421 A1* | 8/2019 | Yoshida | ............. | H04N 5/37455 257/291 |

\* cited by examiner

IMAGE SENSING DEVICE AND IMAGE SENSING METHOD

CROSS-REFERENCE TO RELATED APPLICATION

This application claims the priority benefit of Taiwan application serial no. 106122032, filed on Jun. 30, 2017. The entirety of the above-mentioned patent application is hereby incorporated by reference herein and made a part of this specification.

BACKGROUND OF THE INVENTION

1. Field of the Invention

The invention relates to an image sensing technique, and particularly relates to an image sensing device and an image sensing method for high-quality image sensing and video encoding by a plurality of analog-digital signal converters and a plurality of video encoders compliant with a standard-definition television format.

2. Description of Related Art

Owing to the continuously improved image sensing techniques, the image quality captured by a conventional image sensing system is also becoming better. A conventional analog image sensing system generally complies with a standard-definition television format, e.g., the American National Television System Committee (NTSC) standard, the Phase Alternating Line (PAL) standard, or the SECAM standard. For example, an image sensing system under the NTSC standard is able to render an image of 60/30 frames per second at an image frequency of 60 Hz, each frame having 525 scan lines; an image sensing system under the PAL standard or the SECAM standard is able to render an image of 50/25 frames per second at an image refreshing rate of 50 Hz, each frame having 625 scan lines. The image sensing techniques based on the NTSC standard, the PAL standard, and the SECAM standard are all capable of interlaced scanning. However, the resolutions of images captured based on such standards is gradually unable to satisfy the high-resolution demands for image capturing. If the image quality of captured images becomes higher, the surveillance apparatuses, security systems, and other similar applications on the street, in a shop, or in a vehicle can provide clearer images. Therefore, a better monitoring quality can be rendered.

Since image sensing assemblies (e.g., CMOS pixel arrays) present image signals based on analog signals, an analog-to-digital signal converter or chip having an excellent computing capability is required to quickly convert analog signals into digital signals and achieve a desirable image sensing speed. As the resolution of images captured by an image sensing assembly becomes higher, an analog-to-digital signal converter having a better computing capability is needed. In addition, the chip area and the number of pins of such signal converter may be increased as the image quality is increased. Thus, the cost becomes higher. Moreover, in the conventional image sensing technology, the chip handling analog-to-digital conversion and the chip handling image encoding are usually sold separately. There are not many manufacturers integrating analog-to-digital signal conversion and image encoding in a single chip. Thus, when designing an image sensor, independent work is required to integrate the image sensing assembly, the analog-to-digital signal converter, and the image encoding chip.

SUMMARY OF THE INVENTION

Exemplary embodiments of the invention provide an image sensing device and an image sensing method. According to the image sensing device and the image sensing method, a plurality of signal converters and a plurality of video encoders compliant with a standard-definition television format are adopted to simultaneously perform signal conversion and signal encoding on high-quality image signals partitioned into a plurality of image areas. Accordingly, the hardware configuration cost is reduced.

The image sensing device according to an embodiment of the invention includes an image sensing array, a plurality of first signal converters, and a plurality of first image processing apparatuses. The image sensing array is partitioned into two or more first pixel capturing areas, and each of the first pixel capturing areas is in compliance with a resolution of a standard-definition television (SDTV) format. Each of the first signal converters is coupled to a corresponding first pixel capturing area of the first pixel capturing areas, receives an analog image signal from the corresponding first pixel capturing area, converts the analog image signal in an analog format into a first digital image signal in a digital format, and converts the first digital image signal from a parallel format into a serial format. Each of the first image processing apparatuses is coupled to a corresponding first signal converter of the first signal converters and converts the first digital image signal in the serial format of the corresponding first signal converter into a video signal compliant with a specific video format.

An image sensing method according to an embodiment of the invention includes the following. An image is captured by an image sensing array. The image sensing array is partitioned into two or more pixel capturing areas, and each of the pixel capturing areas is compliant with a resolution of a standard-definition television format or compliant with a resolution of a conventional surveillance camera. Analog image signals are received from corresponding pixel capturing areas of the image capturing areas by a plurality of signal converters, the analog image signals in an analog format are converted into digital image signals in a digital format, and the digital image signals are converted from a parallel format into a serial format by the signal converters. In addition, the digital image signals in the serial format of corresponding signal converters of the signal converters are converted into video signals compliant with a specific video format by a plurality of image processing apparatuses.

Based on the above, in the image sensing device and the image sensing method according to the embodiments of the invention, the single image sensing array is partitioned into the pixel capturing areas, and multiple signal converters and multiple video encoders compliant with the standard-definition television format (e.g., the NTSC, PAL, and/or SECAM standards) are adopted to convert the image signals obtained in the respective pixel capturing areas into multiple video signals in a specific video format (e.g., the CVBS format). The video decoder configured to receive the video signals generated by the image sensing device may integrate the video signals to obtain a single high-definition digital video signal. Since the technology of the analog-to-digital converter and the video encoder compliant with the standard-definition television format is very matured, and the relevant hardware cost is low, the components (e.g., the analog-to-digital converters and video encoders) are integrated in the same integrated circuit in the embodiment, and the video decoder integrating multiple video signals into a single video signal is also quite accessible, the image sensing device according to the embodiments of the invention has a significantly low hardware configuration cost and may be developed and put into practice within a reduced period of time. Moreover, the size of the single image sensing array according to the embodiments may be laterally expanded to increase the number of pixels, and additional signal converters and image processing apparatuses may be added to process the image pixels increased through lateral expansion. Accordingly, the quality of the image sensed is increased. Besides, the control signals of the respective signal converters and the image processing apparatuses are the same, so it does not require other control signals. Furthermore, the single image sensing array is in fact not separated and is integrally disposed in the same integrated circuit, whereas different components are adopted to simultaneously process different pixel capturing areas on the single image sensing array when signal conversion and image processing are carried out. Therefore, the video signals obtained through processing are able to be integrated smoothly without generating twisted or deformed images. In other words, in the embodiments of the invention, the pixels sensed by the image sensing array are read through a plurality of partitioned blocks (e.g., a plurality of pixel capturing areas), but the overall pixels of a sensed image is coherent and complete. Besides, the process of reading pixels by the image sensing array according to the embodiments of the invention does not affect the physical uniformity of the overall pixels of the sensed image. Moreover, the pixel reading speed is facilitated and the configuration cost is reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
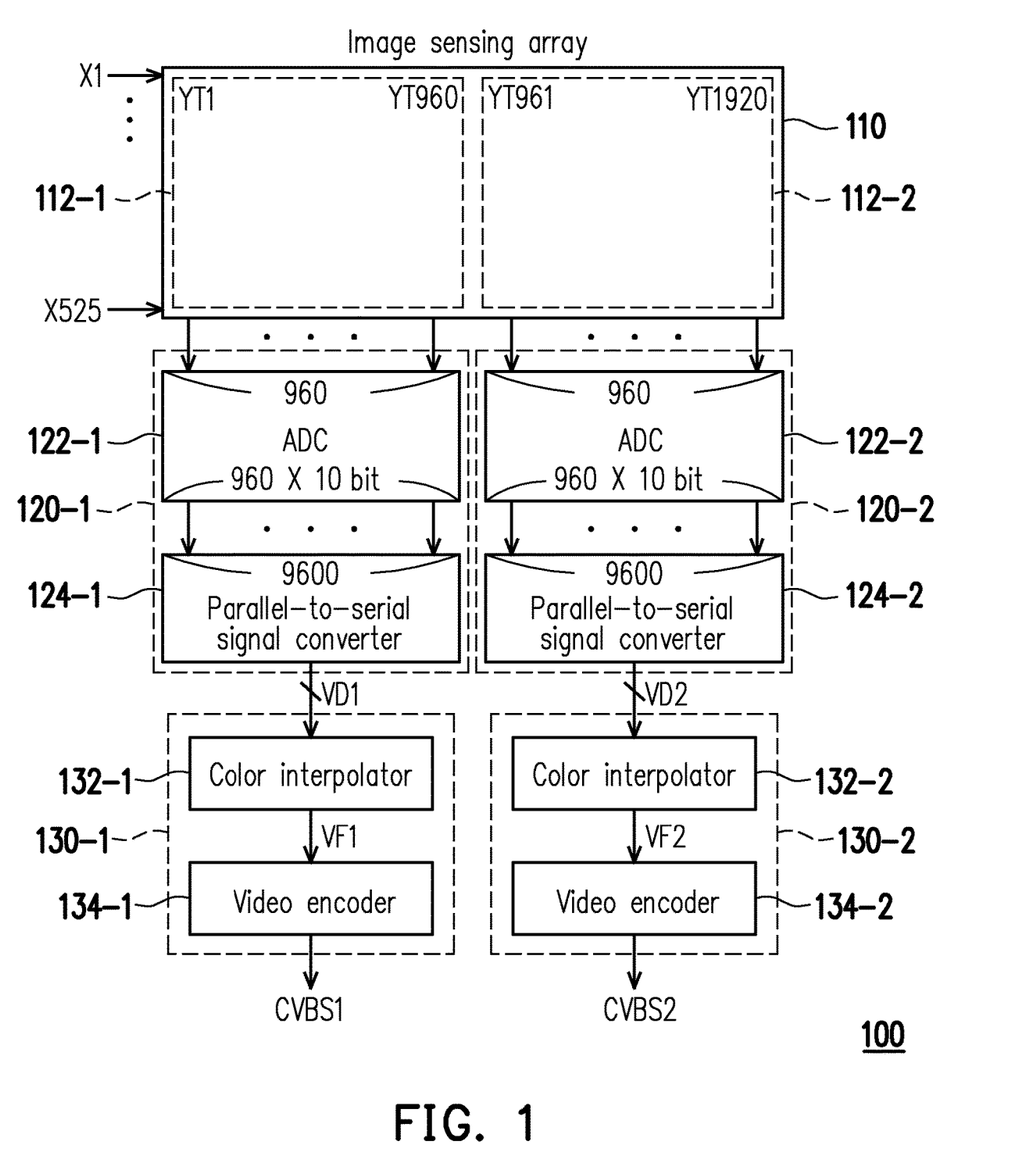
FIG. 1 is a block diagram illustrating an image sensing device according to a first embodiment of the invention.

FIG. 1 is a block diagram illustrating an image sensing device 100 according to a first embodiment of the invention. The image sensing device 100 mainly includes an image sensing array 110, a plurality of first signal converters 120-1 and 120-2, and a plurality of first image processing apparatuses 130-1 and 130-2. The image sensing device 100 of the embodiment is applicable in an information system or an electronic apparatus relating to image capturing, such as a surveillance apparatus, a security system and/or the like.

Figure 2:
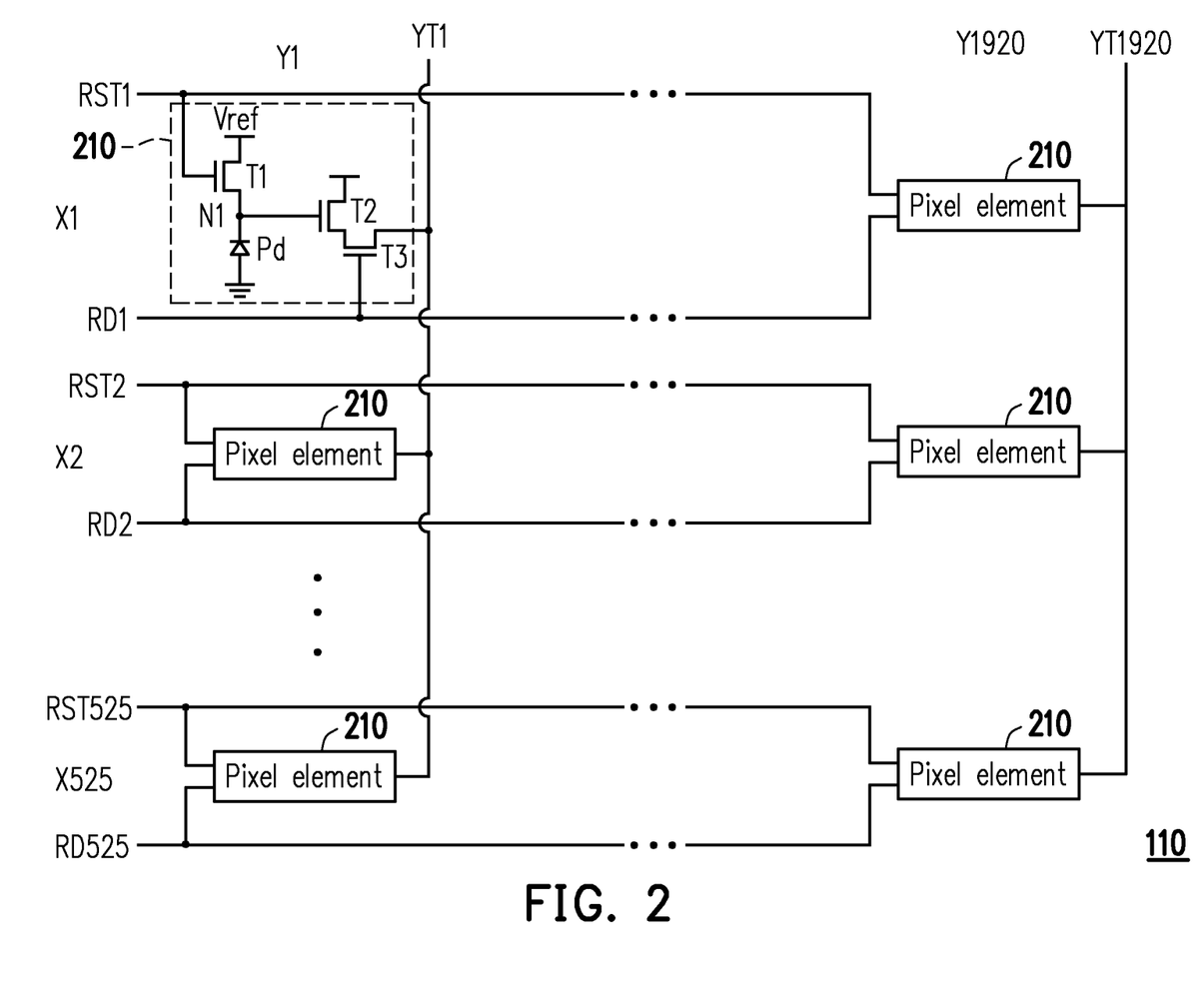
FIG. 2 is a schematic view illustrating an image sensing array of FIG. 1.

FIG. 2 is a schematic view illustrating the image sensing array 110 of FIG. 1. Referring to FIG. 2, the image sensing array 110 includes a plurality of pixel elements 210 arranged into columns and rows. The pixel element 210 of the embodiment may include a photodiode Pd and transistors T1 to T3. Assuming that an interlaced scanning system complies with the American National Television System Committee (NTSC) standard, an image may be displayed by being partitioned into odd and even fields, and a frame rate of the interlaced scanning system may be 1/60 seconds per field. For the ease of description, the pixel element 210 at (X1,Y1) is used as an example, and the coordinate of the pixel element 210 is represented as (X, Y). The image sensing array 110 of the embodiment is formed by 525 rows (e.g., having row lines RST1 to RST525 and control lines RD1 to RD525) and 1920 columns (e.g., column lines YT1 to YT1920) of the pixel elements 210. Accordingly, the image sensing array 110 may be partitioned into first pixel capturing areas 112-1 and 112-2. Accordingly, the two signal converters 120-1 and 120-2 and the image processing apparatuses 130-1 and 130-2 are adopted for image signal capturing and video encoding. Those adopting the embodiment may adjust the number of columns of the image sensing array 110 based on the needs and increase the numbers of the corresponding signal converters and the image processing apparatuses accordingly. For example, an image sensing array may be disposed by arranging 525 rows and 2880 columns of pixel elements. In such case, the image sensing array may be partitioned into three first pixel capturing areas correspondingly requiring three signal converters and three image processing apparatuses for image signal capturing and video encoding.

Referring to FIG. 2, under the control of the transistor T1, a node N1 of the photodiode Pd is initially reset to the reference voltage Vref. The transistor T1 is turned on when the row line RST1 is active. After sufficient exposure time, the control line RD1 may actively turn on the transistor T3. Accordingly, a photodiode voltage at the node N1 translated through the source follower transistor T2 may be read out through the column line RT1. Then, the photodiode voltage is sampled and held in a following correlated doubled sampling (CDS) circuit (not shown). Based on the principle, the photodiodes of each row are exposed to generate voltage signals to the corresponding column lines in response to a state of the row line and a corresponding control line state. Accordingly, through raster scanning and interlaced scanning, the pixel elements 210 are scanned and sampled in an order of the scan lines X1, X3, X5 . . . X525 during an odd field period, and corresponding image data is obtained to display the odd field. Then, the pixel elements 210 are scanned and sampled in an order of the scan lines X2, X4, X6 . . . X524 during an even field period, and corresponding image data is obtained to display the even field. In the image sensing array 110 according to an embodiment of the invention, a typical Bayer pattern color filter is deployed on the pixel elements 210. Accordingly, each of the pixel elements 210 senses only image information of one of red, green, and blue.

Back to FIG. 1, the image sensing array 110 is partitioned into at least two or more pixel capturing areas, such as the first pixel capturing areas 112-1 and 112-2 shown in FIG. 1. In other words, the number of the first pixel capturing areas 112-1 and 112-2 partitioned in the image sensing array 110 of the embodiment is two. Each of the first pixel capturing areas 112-1 and 112-2 meet a resolution of a standard-definition television format or a resolution of a conventional surveillance camera. For example, the pixel elements in the each of the pixel capturing areas 112-1 and 112-2 are in an arrangement of 525×960 pixels. Therefore, the resolutions of the pixel capturing areas 112-1 and 112-2 is compliant with the resolution under the NTSC standard. The aforementioned standard-definition television format refers to an image resolution compliant with the standard of 720×576 pixels but not high enough to reach the High Definition (HD) television video playback standard, such as the NTSC standard, the Phase Alternating Line (PAL) standard, or the SECAM standard. The image sensing array 110 of the embodiment may capture an image based on a temporal sequence compliant with the standard-definition television format (e.g., NTSC, PAL, or SECAN standard). The aforementioned resolution of the conventional surveillance camera may be compliant with one of the image formats commonly used in conventional surveillance cameras, such as 320×240 under the Common Intermediate Format (CIF) image transmission format, an image resolution of 176×144 under the Quarter CIF (QCIF) image transmission format, an image resolution of 640×480 under the VGA format, an image resolution of 960×480 in the 960 H format, etc.

Since the development of circuit structures and signal converters relating to the standard-definition television format is already quite matured, an image sensing array having a high resolution (e.g., the image sensing array 110 shown in FIG. 1) in the embodiments of the invention is partitioned into at least two or more pixel capturing areas (e.g., the first pixel capturing areas 112-1 and 112-2 shown in FIG. 1), and a signal converter (e.g., the first signal converters 120-1 and 120-2 shown in FIG. 1) and an image processing apparatus (e.g., the first image processing apparatuses 130-1 and 130-2 shown in FIG. 1) is correspondingly arranged for each of the pixel capturing areas (e.g., 112-1 and 112-2) to convert the image signals obtained in the pixel capturing areas into a plurality of video signals in a specific video format (e.g., the Composite Video Broadcast Signal (CVBS) format). In addition, the image sensing array 110, the first signal converters 120-1 and 120-2, and the first image processing apparatuses 130-1 and 130-2 may be integrated in the same integrated circuit, so a circuit board may have a smaller wiring area. In another embodiment of the invention, since the image sensing device 100 may be disposed in front of a backlight source, the image sensing array 110 and the first signal converters 120-1 and 120-2 in the image sensing device 100 may be disposed in and integrated into the same integrated circuit (also referred to as a first integrated circuit/first chip) to avoid the irradiation of the backlight source. Correspondingly, the first image processing apparatuses 130-1 and 130-2 may be integrated in another integrated circuit (also referred to as a second integrated circuit/second chip). Accordingly, the image sensing array 110 and the first signal converters 120-1 and 120-2 on the first chip may be disposed on a circuit board of the image sensing device 100 (e.g., a video camera), and the first image processing apparatuses 130-1 and 130-2 on the second chip may be disposed on another circuit chip. In addition, the first chip and the second chip may transmit digital image signals through pads and cables.

Besides, in technologies relating to image receiving or image decoding, an apparatus having such functions may often need to simultaneously receive digital video signals from a plurality of sources and play the video signals at the same time. Thus, some manufacturers already come up with apparatuses or chips capable of simultaneously receiving a plurality of video signals in the CVBS format and integrating the video signals into a single video signal. An example of such chip is a chip (model no. DM5886) sold by Davicom Semiconductor, Inc. The chip includes a video encoder capable of integrating video of four channels in the format of NTSC/PAL a single standard-definition/high-definition video. The circuit structure at a video receiving end apparatus in the embodiment of the invention may be implemented in/with the chip. In other words, the image sensing device 100 of the embodiment adopts multiple signal converters and related signal video encoders compliant with the standard-definition television format (e.g., the NTSC, PAL, or SECAM standard) to simultaneously process portions of a single high-quality image signal and thereby generate multiple video signals. A remote image receiving device receiving the video signals may include an image decoder receiving and integrating the video signals a single complete video with high-quality. Thus, the high-quality image can be captured, encoded, and decoded with a hardware structure at a lower cost.

In the following, the first signal converters 120-1 and 120-2 shown in FIG. 1 are described in greater detail. The first signal converters 120-1 and 120-2 have the same circuit structure. In the embodiment, the first signal converter 120-1 is described as an example. The first signal converter 120-1 includes an analog-to-digital converter (ADC) 122-1 and a parallel-to-serial signal converter 124-1. The first signal converter 120-2 includes an analog-to-digital signal converter 122-2 and a parallel-to-serial signal converter 124-2. The analog-to-digital signal converter 122-1 of the embodiment has 960 input ends and 9600 output ends. The input ends of the ADC 122-1 are respectively connected to the column lines (e.g., column lines YT1 to YT960) of the respective pixel elements in the first pixel capturing area 112-1. Similarly, input ends of the ADC 122-2 are respectively connected to the column lines (e.g., column lines YT961 to YT1920) of the respective pixel elements in the first pixel capturing area 112-2. Since the analog signal obtained at each input end of the ADC may be converted into a 10-digit digital signal, and each of the ADC 122-1 and the ADC 122-2 has 960 input ends, the number of out ends of each of the ADC 122-1 and the ADC 122-2 is 9600 (i.e., 960 input ends×10 digits=9600 output ends).

Figure 3:
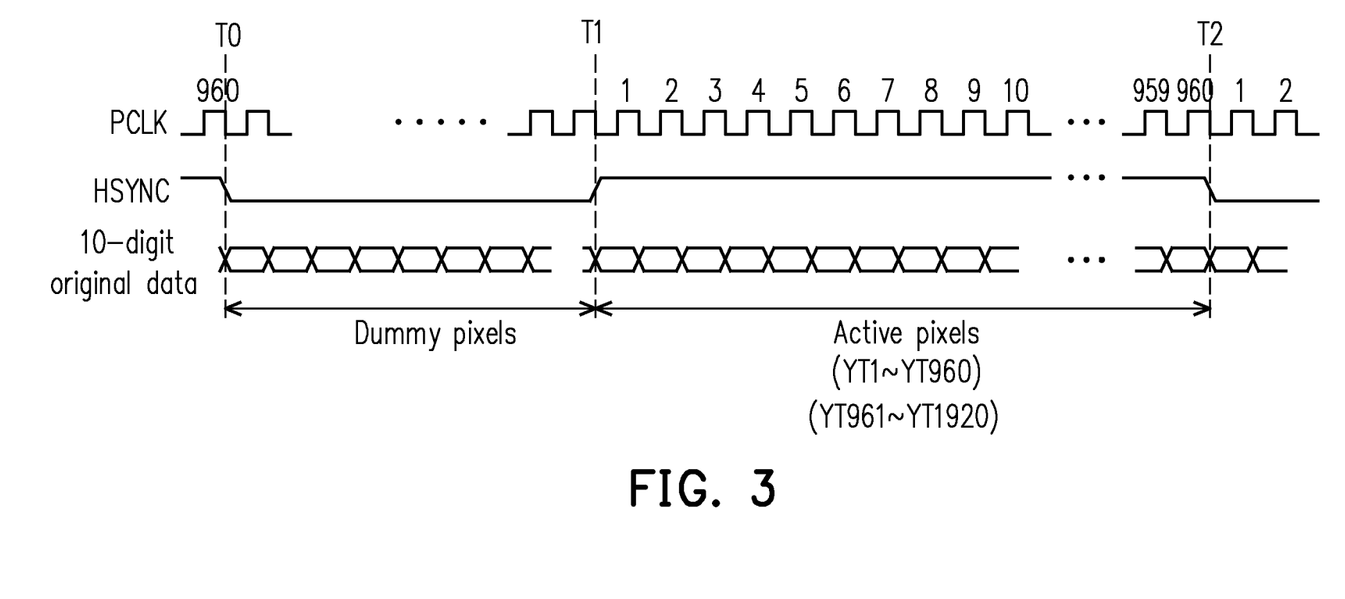
FIG. 3 is a timing diagram illustrating respective signals of the image sensing array and an analog-to-digital signal converter of FIG. 1.

FIG. 3 is a timing diagram illustrating respective signals of the image sensing array and an analog-to-digital signal converter of FIG. 1. In the following, the pixel elements corresponding to the column lines YT1 to YT960 are referred to as active pixels. Referring to FIG. 3, when a horizontal synchronizing signal HSYNC is disabled (i.e., during a period between T0 to T1), signals produced from the output ends of the ADC 122-1 are values of dummy pixels. When the horizontal synchronizing signal HSYNC in FIG. 3 is enabled (i.e., during a period between T1 to T2), the pixel elements of specific scan lines in the first pixel capturing area 112-1 may sequentially provide sensed analog signals to the column lines YT1 to YT960 thereof based on a pixel frequency line PCLK, and the input ends of the ADC 122-1 may be sequentially provided with analog image signals read out from the respective pixel elements. Then, the ADC 122-1 may sequentially convert the analog image signals from an analog format into raw data in a 10-digit digital format, so as to generate first digital image signals on the 9600 output ends of the ADC 122-1.

The parallel-to-serial signal converter 124-1 converts the first digital image signals on the output ends of the ADC 122-1 from a parallel format into a serial format. In other words, the parallel-to-serial signal converter 124-1 has 9600 input ends and 10 output ends. In addition, by exploiting a time-dividing multiplexing technique, the 9600-digit parallel first digital image signals are converted into 10-digit serial first digital signals VD1. In addition, the parallel-to-serial signal converter 124-2 also has 9600 input ends and 10 output ends. In addition, through the time-dividing multiplexing technique, the 9600-digit parallel first digital image signals are converted into 10-digit serial first digital signals VD2. The control signal of FIG. 3 (e.g., the horizontal synchronizing signal HSYNC, the pixel frequency signal PCLK) may be simultaneously provided to the analog-to-digital signal converters 122-1 and 122-1 and the parallel-to-serial signal converter 124-1 and 124-2. Accordingly, the analog-to-digital signal converters 122-1 and 122-1 and the parallel-to-serial signal converter 124-1 and 124-2 are able to facilitate the signal converting speed of the first image sensing array 110 without the needs for designing other control signals. Hence, the quality of the image captured is facilitated.

The ADC 122-2 is similar to the ADC 122-1. When the horizontal synchronizing signal HSYNC is enabled (i.e., during the period between T1 to T2), the pixel elements of specific scan lines in the first pixel capturing area 112-2 may sequentially provide sensed analog signals to the column lines YT961 to YT1920 thereof based on the pixel frequency line PCLK, and the input ends of the ADC 122-2 may be sequentially provided with analog image signals read out from the respective pixel elements. The parallel-to-serial signal converter 124-2 is similar to the parallel-to-serial signal converter 124-1. The parallel-to-serial signal converter 124-2 also converts the first digital image signals generated from the ADC 122-2 from a parallel format into a serial format.

In the following, the first image processing apparatuses 130-1 and 130-2 are described in greater detail. Since the first image processing apparatuses 130-1 and 130-2 have similar circuit structures, the first image processing apparatus 130-1 is described as an example. The first image processing apparatus 130-1 includes a color interpolator 132-1 and a video decoder 134-1. The color interpolator 132-1 is coupled to the corresponding signal converter 120-1 to perform color interpolation on the first digital image signals in the serial format to generate first full-color image signals VF1. The first full-color image signal VF1 of the embodiment is formed by a red-light (R) image, a green-light (G), and a blue-light (B) image. The video encoder 134-1 is coupled to the color interpolator 132-1. The video encoder 134-1 converts the first full-color image signal into a video signal CVBS1 compliant with a specific video format.

Specifically, for each of the pixels to display a full-color image, a color interpolation arithmetic calculation is carried out to calculate an image in the image sensing array. The color interpolation of the embodiment requires a 3×3 pixel matrix. In other words, the color interpolators 132-1 and 132-2 require three continuous row data for color interpolation. Therefore, an additional buffer (e.g., a buffer having a capacity of storing three scan lines) may be disposed in the color interpolators 132-1 and 132-2 of the embodiment to store odd field data or even field data and perform color interpolation accordingly. Thus, the color interpolators 132-1 and 132-2 may perform color interpolation on the first digital image signals corresponding to the signal converters 120-1 and 120-2 to respectively generate the first full-color image signals. The first full-color image signal VF1 is formed by a red-light (R) image, a green-light (G), and a blue-light (B) image. The video encoders 134-1 and 134-2 may respectively convert the first full-color image signals into the video signals CVBS1 and CVBS2 compliant with a specific video format (e.g., the CVBS format).

Figure 4:
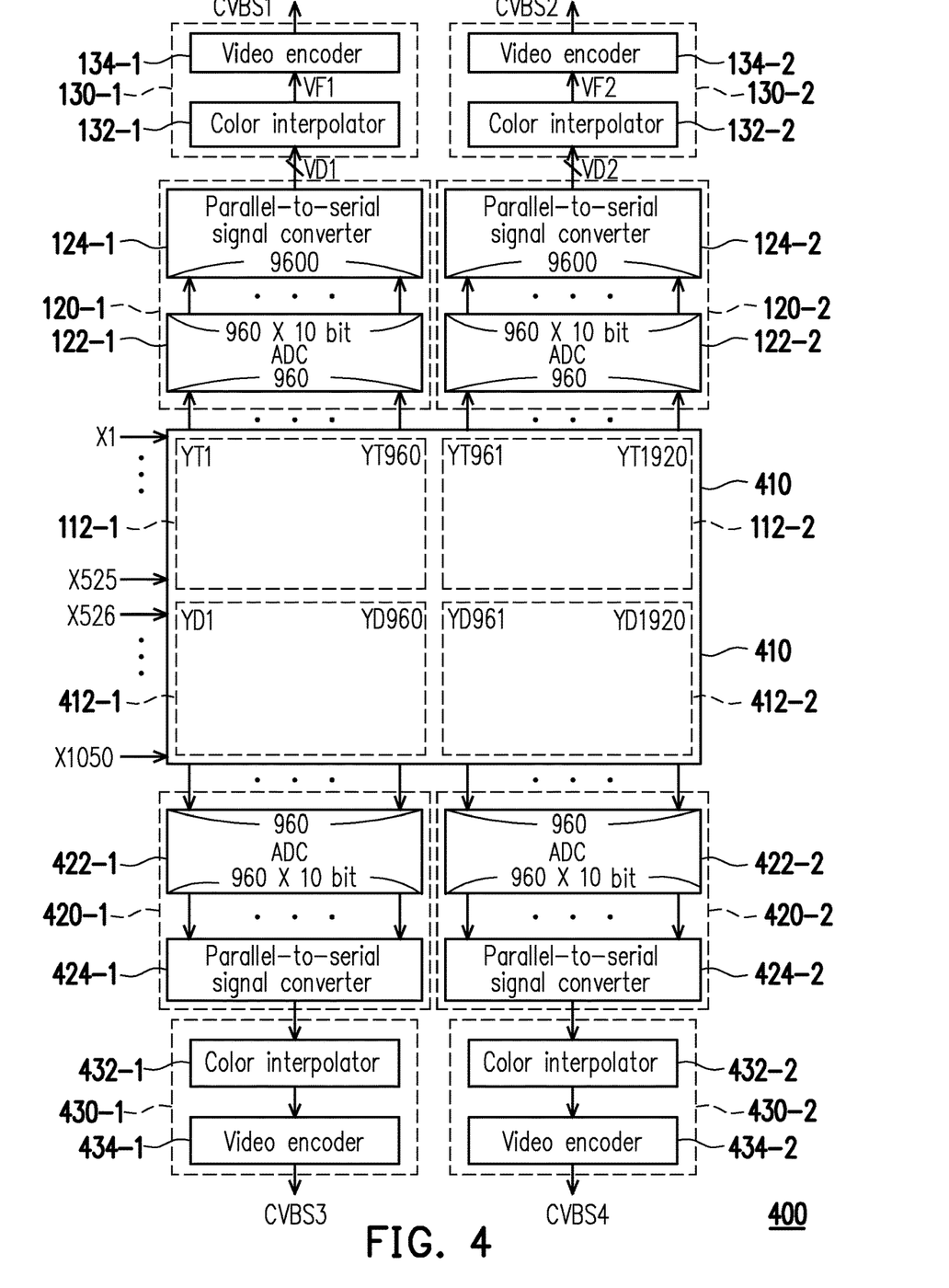
FIG. 4 is a block diagram illustrating an image sensing device according to a second embodiment of the invention.

FIG. 4 is a block diagram illustrating an image sensing device 400 according to a second embodiment of the invention. Compared with FIG. 1, the image sensing device 400 includes an image sensing array in a larger size (i.e., 1050×1920 pixels) and further includes another set of image sensing apparatus in addition to the image sensing apparatus 100 having the first signal converters 120-1 and 120-2 and the first image processing apparatuses 130-1 and 130-2. In other words, the image sensing device 400 further includes a plurality of second signal converters 420-1 and 420-2 and a plurality of second image processing apparatuses 430-1 and 430-2.

The second signal converters 420-1 and 420-2 and the second image processing apparatuses 430-1 and 430-2 share similar functions and circuit structures with the first signal converter 120-1 and 120-2 and the first image processing apparatuses 130-1 and 130-2 shown in FIG. 1. In addition to the image capturing areas 112-1 and 112-2, the image sensing array 410 further includes two or more image capturing areas, such as image capturing areas 412-1 and 412-2, partitioned in the image sensing array 410. Each of the second pixel capturing areas 412-1 and 412-2 are compliant with the resolution of the standard-definition television format. The second signal converters 420-1 and 420-2 are respectively coupled to the second pixel capturing areas 412-1 and 412-2. An ADC 422-1 of the second signal converter 420-1 receives an analog image signal from the corresponding second pixel capturing area 412-1, and converts the analog image signal in an analog format into a second digital image signal in a digital format. A parallel-to-serial signal converter 424-1 of the second signal converter 420-1 converts the second digital signal in a parallel format into a serial format. Similarly, an ADC 422-2 of the second signal converter 420-2 receives an analog image signal from the corresponding second pixel capturing area 412-2, and converts the analog image signal in an analog format into a second digital image signal in a digital format. A parallel-to-serial signal converter 424-2 of the second signal converter 420-2 converts the second digital signal in a parallel format into a serial format.

The second image processing apparatuses 430-1 and 430-2 are respectively coupled to the corresponding second signal converters 420-1 and 420-2. A color interpolator 432-1 in the second image processing apparatus 430-1 performs color interpolation on the second digital image signal in the serial format to generate a second full-color image signal. A video encoder 434-1 in the second image processing apparatus 430-1 converts the second full-color image signal into a second video signal CVBS3 compliant with a specific video format. Similarly, a color interpolator 432-2 in the second image processing apparatus 430-2 performs color interpolation on the second digital image signal in the serial format to generate a second full-color image signal. A video encoder 434-2 in the second image processing apparatus 430-2 converts the second full-color image signal into a second video signal CVBS4 compliant with a specific video format.

In order for the image sensing array 410 to operate normally and comply with the interlaced scanning mode under the NTSC standard, odd-numbered scan lines (e.g., odd-numbered scan lines X1, X3, X5 . . . X525 in the pixel capturing areas 112-1 and 112-2 and odd-numbered scan lines X527, X529, X531 . . . X1049 in the pixel capturing areas 412-1 and 412-2) in FIG. 4 are sequentially scanned, and then even-numbered scan lines (e.g., even-numbered scan lines X2, X4, X6 . . . X524 in the pixel capturing areas 112-1 and 112-2 and even-numbered scan lines X526, X528, X530 . . . X1050 in the pixel capturing areas 412-1 and 412-2) are scanned, or the even-numbered scan lines are scanned, and then the odd-numbered scan lines are scanned in the pixel capturing areas, so as to obtain image data compliant with the NTSC standard.

As shown in FIG. 4, the scan lines X1 to X525 and the scan lines X526 to X1050 perform pixel scanning at a rate of 60 Hz per frame. Analog pixel data from the pixel array may be output from the column lines YT1, YT2 . . . YT1920 and the column lines YD1, YD2 . . . YD1920. The column lines are classified into four groups. Data of the column lines YT1 to YT960 of the first group is output to the ADC 122-1, data of the column lines YT961 to YT1920 of the second group is output to the ADC 122-2, data of the column lines YD1 to YD960 of the third group is output to the ADC 422-1, and data of the column lines YD961 to YD1920 of the fourth group is output to the ADC 422-2. The ADCs 122-1, 122-2, 422-1, and 422-2 of the embodiment are 10-digit analog-to-digital converters implemented as correlated double sampling analog-to-digital signal converters. Based on the needs for precision on image data, those adopting the embodiment of the invention adopt ADCs outputting 8 to 12 digits.

Figure 5:
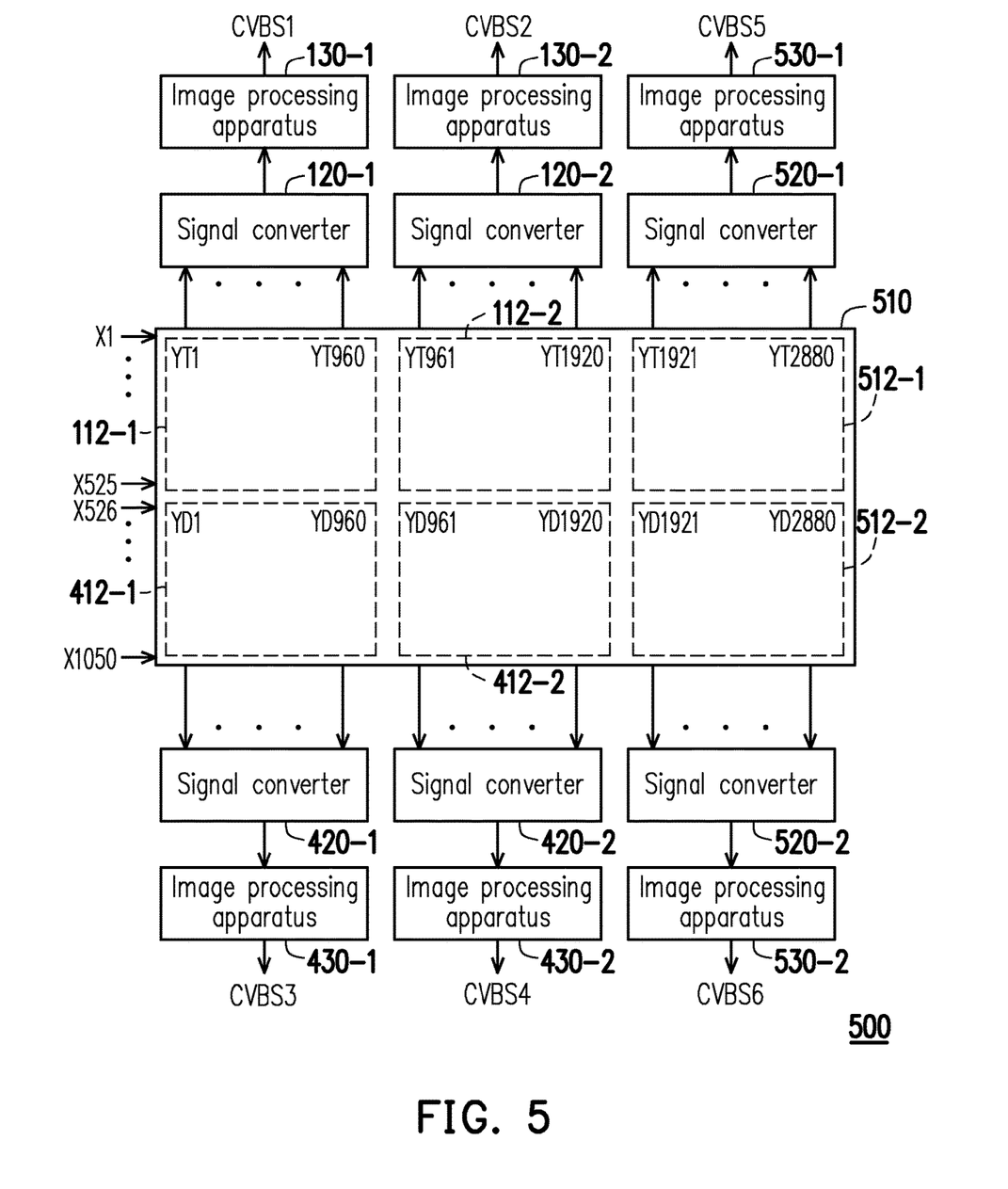
FIG. 5 is a block diagram illustrating an image sensing device according to a third embodiment of the invention.

FIG. 5 is a block diagram illustrating an image sensing device 500 according to a third embodiment of the invention. What FIG. 5 differs from FIG. 4 is that an image sensing array 510 of the image sensing device 500 of FIG. 5 is in a size of 1050×2880 pixels. Compared with the image sensing array 410 (1050×1920 pixels), the image sensing array 510 is expanded laterally by a certain number of pixels. Therefore, in addition to the pixel capturing areas 112-1, 112-2, 412-1 and 412-2, the image sensing array 510 further includes additional pixel capturing areas 512-1 and 512-2 partitioned in the image sensing array 510. Accordingly, the image sensing device 500 according to an embodiment of the invention may additionally include a plurality of signal converters (e.g., signal converters 520-1 and 520-2) and a plurality of image processing apparatuses (e.g., image processing apparatuses 530-1 and 530-2) to simultaneously process pixels newly added through lateral expansion, such as simultaneously reading the column lines YT1, YT961, and TY1921 of the pixel elements, simultaneously reading the column lines YT2, YT962, and TY 1922, etc.

Accordingly, in the image sensing device according to the embodiments of the invention, the number of sensed pixels may be increased through lateral expansion of the image sensing array. The image quality is therefore facilitated. Besides, the control signals of the respective signal converters (e.g., the signal converters 520-1 and 520-2) and the image processing apparatuses (e.g., the image processing apparatuses 530-1 and 530-2) that are newly added are the same as those of other signal converters and image processing apparatuses, and it is not necessary to design other control signals. In other words, the image sensing device according to the embodiments of the invention includes only a single image sensing array. The image sensing array may be partitioned into 2×N pixel capturing areas, wherein N is a positive integer. For example, the numbers of the pixel capturing areas in FIGS. 1, 4, and 5 are respectively 2, 4, and 6. Correspondingly, the numbers of the signal converters (including the first and second signal converters) and the image processing apparatuses (including the first and second image processing apparatuses) is 2×N. For example, the numbers of the signal converters and the image processing apparatuses in FIGS. 1, 4, and 5 are respectively 2, 4, and 6. Particularly, the image sensing array 410 in FIG. 4 is partitioned into 2×2 pixel capturing areas, and each pixel capturing area is compliant with the resolution of the standard-definition television format. The image sensing array 510 in FIG. 5 is partitioned into 2×3 pixel capturing areas, and each pixel capturing area is compliant with the resolution of the standard-definition television format. Accordingly, the quality of the image captured by the image sensing device (e.g., the image sensing devices 100, 400, and 500) according to the embodiments of the invention may be up to two million pixels (2M pixels, such as 1050×1920 pixels), three million pixels (3M pixels, e.g., 1050×2880 pixels), or even meet the 8K image quality, and such image quality may be rendered by the image sensing devices 100, 400, and 500 based on the control signals compliant with the original standard-definition television format. For example, a conventional crystal oscillator that generates a 36 Mhz oscillation signal may be adopted to generate the respective control signals in the image sensing device.

Figure 6:
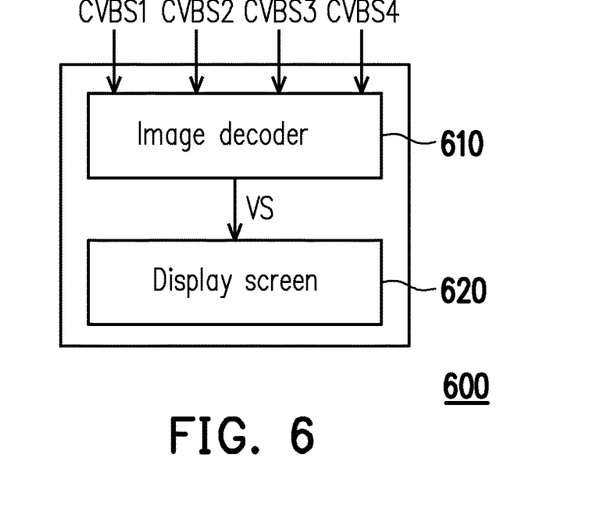
FIG. 6 is a block diagram illustrating an image receiving device according to an embodiment of the invention.

FIG. 6 is a block diagram illustrating an image receiving device 600 according to an embodiment of the invention. The image receiving device 600 includes an image decoder 610 and a display screen 620. The image decoder 610 is configured to integrate the video signals generated by the image processing apparatus 400 of FIG. 4 into a single complete video VS with high-definition. The complete video VS is video data compliant with the standards of 2M, 3M or even 8M pixels. Those adopting the embodiment of the invention may also implement an image receiving device receiving the video signals CVBS1 and CVBS2 generated by the image processing device 00 shown in FIG. 1 and an image receiving device receiving the video signals CVBS1 to CVBS6 generated by the image processing device 500 shown in FIG. 5 based on technical concepts relating the image processing device 600 of FIG. 6. The display screen 620 may receive and play the complete video VS to show the video in a high image quality.

Figure 7:
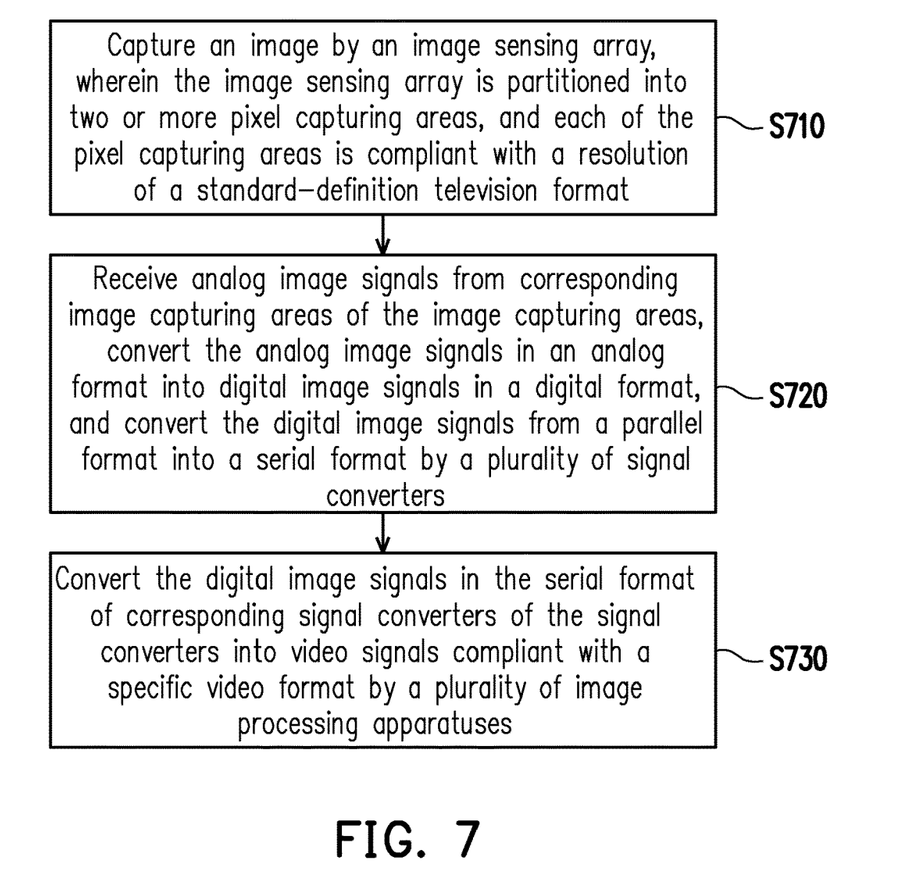
FIG. 7 is a flowchart illustrating an image sensing method according to an embodiment of the invention.

FIG. 7 is a flowchart illustrating an image sensing method according to an embodiment of the invention. The image sensing method described in FIG. 7 is suitable for the image processing devices 100, 400, and 500. At Step S710, an image is captured through an image sensing array partitioned into two or more pixel capturing areas. Each of the pixel capturing areas is compliant with a resolution of a standard-definition television format. At Step S720, analog image signals are received from corresponding pixel capturing areas of the pixel capturing areas through a plurality of signal converters. In addition, the analog image signals in an analog format are converted into digital image signals in a digital format, and the digital image signals are converted from a parallel format into a serial format. Then, at Step S730, the digital image signals in the serial format in corresponding signal converters of the signal converters are converted into video signals compliant with a specific video format through a plurality of image processing apparatuses.

Details regarding Steps S710 to S730 may be referred to the respective embodiments above.

The image sensing device according to the embodiments of the invention may be compliant with a design process based on a back side-illumination (BSI) manufacturing process, so as to expand the image sensing array laterally to increase the number of pixels for sensing and thereby facilitate the image quality. From another perspective, in the design process based on the BSI manufacturing process, photosensitive diodes are disposed on a light receiving surface, whereas other circuit components (e.g., transistors, resistors, capacitors, metal wire, etc.) are disposed on another surface that is not the light receiving surface where the photosensitive diode are disposed. Therefore, an effective light sensing area of the photosensitive diodes is increased without being affected by wires and the circuit layout.

Figure 8:
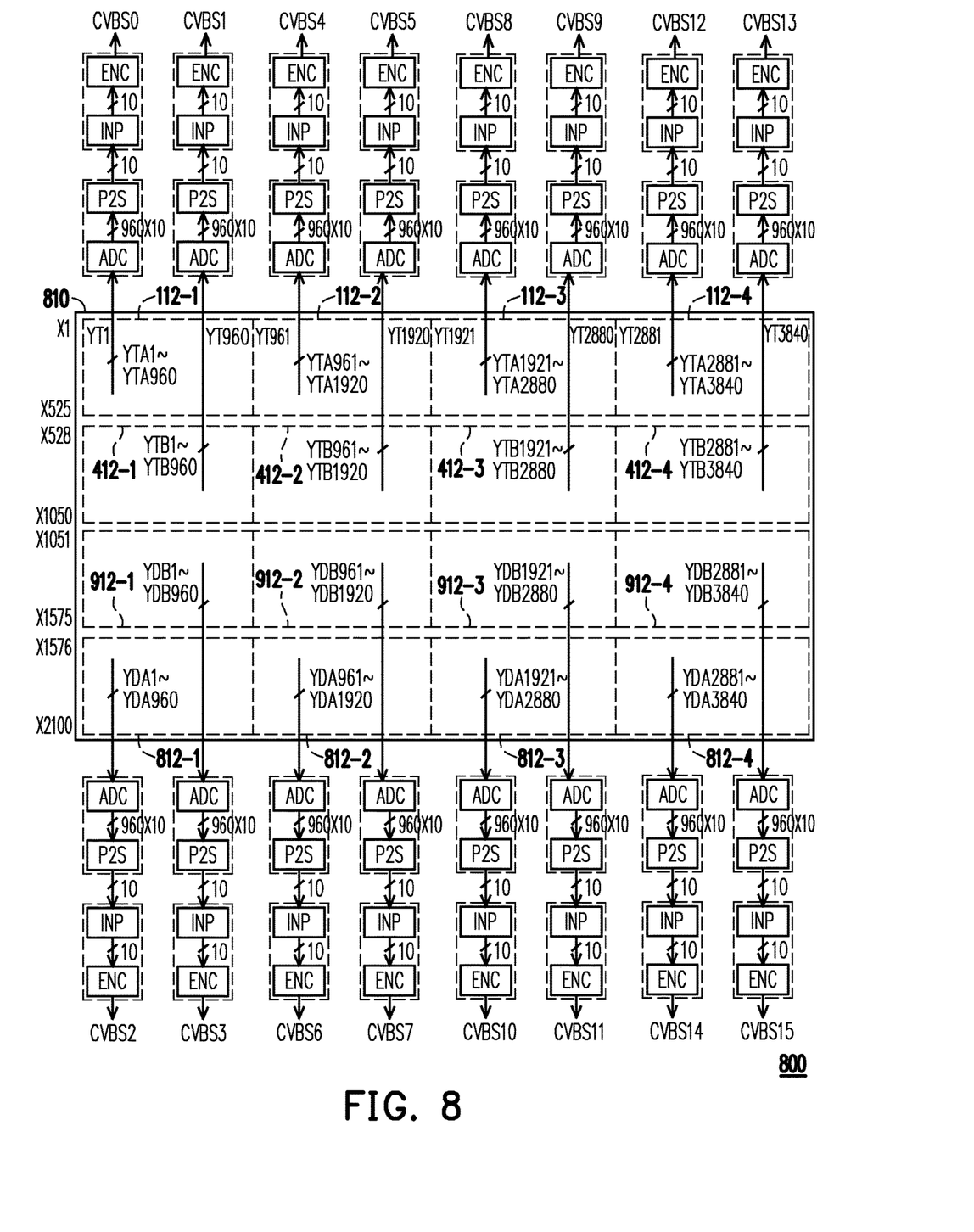
FIG. 8 is a block diagram illustrating an image sensing device according to a fourth embodiment of the invention.

In addition to increasing the number of pixels through lateral expansion, the number of pixels of the image sensing array according to the embodiments of the invention may also be increased through longitudinal expansion to facilitate the resolution of each frame. FIG. 8 is a block diagram illustrating an image sensing device 800 according to a fourth embodiment of the invention. What FIG. 8 differs from FIG. 4 is that an image sensing array 810 in the image sensing device 800 shown in FIG. 8 is in a size of 3840× 2010 pixels. In other words, the image sensing array 810 is a image sensor with a number of pixels as high as 4K*2K. Specifically, the image sensing array 810 is partitioned into a plurality pixel capturing areas (e.g., 112-1 to 112-4, 412-1 to 412-4, and 812-1 to 812-4). Each of the pixel capturing areas 112-1 to 112-4, 412-1 to 412-4, 812-1 to 812-4 are compliant with the resolution of the standard-definition television format (i.e., 525×960 pixels). Particularly, the image sensing array 410 in FIG. 4 is partitioned into 2×2 pixel capturing areas, and each pixel capturing area is compliant with the resolution of the standard-definition television format. The image sensing array 810 in FIG. 8 is partitioned into 4×4 pixel capturing areas, and each pixel capturing area is compliant with the resolution of the standard-definition television format.

The image sensing device 800 of FIG. 8 further includes a plurality of signal converters and a plurality of image processing apparatuses. Each of the signal converters is formed by an analog-to-digital signal converter ADC and a parallel-to-serial signal converter P2S. Each of the image processing apparatuses is formed by a color interpolator INP and a video encoder ENC. Each pixel capturing area corresponds to one of the signal converters and one of the image processing apparatuses. The signal processing apparatuses respectively generate video signals CVBS0 to CVBS15 compliant with a specific video format. For example, the signal processing apparatus corresponding to the pixel capturing area 112-1 converts signals captured by a plurality of pixel elements in the pixel capturing area 112-1 into the video signal CVBS0 compliant with a specific video format; the signal processing apparatus corresponding to the pixel capturing area 412-1 converts signals captured by a plurality of pixel elements in the pixel capturing area 412-1 into the video signal CVBS1 compliant with a specific video format; the signal processing apparatus corresponding to the pixel capturing area 812-1 converts signals captured by a plurality of pixel elements in the pixel capturing area 812-1 into the video signal CVBS2 compliant with a specific video format; and the signal processing apparatus corresponding to the pixel capturing area 912-1 converts signals captured by a plurality of pixel elements in the pixel capturing area 912-1 into the video signal CVBS3 compliant with a specific video format.

From another perspective, as shown in FIG. 8, the scan lines X1 to X525, the scan lines X526 to X1050, the scan lines X1051 to X1575, and the scan lines X1076 to X2010 perform line-by-line pixel scanning at a rate of 60 Hz per frame. Analog pixel data from the image sensing array 810 is output from the column lines YTA1 to YTA3840, YTB1 to YTB3840, YDA1 to YDA3840, and YDB1 to YDB3840. The column lines are classified into 16 groups. Data of the column lines YTA1 to YTA960 of the first group is output to the corresponding ADC, P2S, INP, and ENC to generate a corresponding video signal CVBS0. Data of the column lines YTB1 to YTB960 of the second group is output to the corresponding ADC, P2S, INP, and ENC to generate a corresponding video signal CVBS1. Data of the column lines YDA1 to YDA960 of the third group is output to the corresponding ADC, P2S, INP, and ENC to generate a corresponding video signal CVBS2. Data of the column lines YDB1 to YDB960 of the fourth group is output to the corresponding ADC, P2S, INP, and ENC to generate a corresponding video signal CVBS3. Other video signals may be generated in a similar manner. The ADC of the embodiment is implemented as a 10-digit analog-to-digital signal converter implemented as correlated double sampling analog-to-digital signal converter. Based on the needs for precision on image data, those adopting the embodiment of the invention adopt ADCs outputting 8 to 12 digits.

Therefore, the image sensing array 110 shown in FIG. 1 may be partitioned into 2×1 pixel capturing areas, the image sensing array 410 shown in FIG. 4 may be partitioned into 2×2 pixel capturing areas, the image sensing array 510 shown in FIG. 5 may be partitioned into 2×3 pixel capturing areas, and the image sensing array 810 shown in FIG. 8 may be partitioned into 4×4 pixel capturing areas. Therefore, those adopting the embodiment may laterally expand the image sensing array based on the design needs. For example, the image sensing array 510 may be set to be partitioned into 2×N pixel capturing areas, wherein N is a positive integer. Besides, those adopting the embodiment may also laterally and longitudinal expand the image sensing array based on the design needs. For example, the image sensing array 510 may be set to be partitioned into M×N pixel capturing areas, wherein M is a multiple of M, and M and N are positive integers. Correspondingly, the number of the first signal converters and the number of the first image processing apparatuses are set to be M×N. The number of scan lines in each frame may be determined based on the number of M (e.g., the number of scan lines in each frame is 525×M), and the number of pixels output by each scan line may be determined based on the number of N (e.g., the number of pixels output by each scan line is 960×N). Thus, those adopting the embodiments of the invention may set the number of pixel capturing areas in the design of the image sensing array as 4×4, 4×6, 4×8, 6×4, 6×6, 6×8, etc., and the number of pixel capturing areas is not limited to the exemplary embodiments described above. Based on the above, the pixels sensed by the image sensing array are read through a plurality of partitioned blocks (e.g., a plurality of pixel capturing areas), but the overall pixels of a sensed image are coherent and complete. Besides, the process of reading pixels by the image sensing array does not affect the physical uniformity of the overall pixels of the sensed image. In addition, by operating the multiple signal converters and image processing apparatuses that are already welldeveloped in the conventional art at the same time, the pixel reading speed may be facilitated, and the configuration cost may be reduced.

In view of the foregoing, in the image sensing device and the image sensing method according to the embodiments of the invention, two image capturing arrays are each partitioned into the pixel capturing areas, and multiple signal converters and multiple video encoders compliant with the standard-definition television format (e.g., the NTSC, PAL, and/or SECAM standards) are adopted to convert the image signals obtained in the respective pixel capturing areas into multiple video signals in a specific video format (e.g., the CVBS format). The video decoder configured to receive the video signals generated by the image sensing device may integrate the video signals to obtain a single high-definition video signal. Since the technology compliant with the standard-definition television format is very matured, and the relevant hardware cost is low, the assemblies (e.g., the analog-to-digital converters and video encoders) are integrated in the same integrated circuit in the embodiment, and the video decoder integrating multiple video signals into a single video signal is also quite accessible, the image sensing device according to the embodiments of the invention has a significantly low hardware configuration cost and may be developed and put into practice within a reduced period of time. In other words, in the embodiments of the invention, the pixels sensed by the image sensing array are read through a plurality of partitioned blocks (e.g., a plurality of pixel capturing areas), but the overall pixels of a sensed image is coherent and complete. Besides, the process of reading pixels by the image sensing array according to the embodiments of the invention does not affect the physical uniformity of the overall pixels of the sensed image. Moreover, the pixel reading speed is facilitated and the configuration cost is reduced. A most advantage of this innovate design approach is the older clock is remained at original CVBS clock rate regardless of the pixel array is 2 k×1 k, 4 k×2 k or 8 k×4 k pixels, and the original CVBS pixel clock rate for 960×720 pixels is 36 MHz.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensing device, comprising:
   an image sensing array, partitioned into at least two or more first pixel capturing areas, wherein each of the first pixel capturing areas is compliant with a resolution of a standard-definition television format or compliant with a resolution of a conventional surveillance camera;
   a plurality of first signal converters, wherein each of the first signal converters is coupled to a corresponding first pixel capturing area of the first pixel capturing areas, receives an analog image signal from the corresponding first pixel capturing area, converts the analog image signal in an analog format into a first digital image signal in a digital format, and converts the first digital image signal from a parallel format into a serial format; and
   a plurality of first image processing apparatuses, wherein each of the first image processing apparatuses is coupled to a corresponding first signal converter of the first signal converters and converts the first digital image signal in the serial format of the corresponding first signal converter into a video signal compliant with a specific video format,
   wherein each image sensing array captures an image based on a temporal sequence compliant with the standard-definition television format.

2. The image sensing device as claimed in claim 1, wherein the image sensing array, the first signal converters, and the first image processing apparatuses are integrated in an integrated circuit.

3. The image sensing device as claimed in claim 1, wherein the image sensing array and the first signal converters are disposed and integrated in a first integrated circuit, and the first image processing apparatuses are disposed in a second integrated circuit.

4. The image sensing device as claimed in claim 1, wherein the video signals generated by the first image processing apparatuses are received by an image receiving device,
   and the image receiving device comprises:
   a video decoder, integrating the video signals generated by the image processing apparatuses into a single complete video.

5. The image sensing device as claimed in claim 1, wherein each of the first signal converters comprises:
   an analog-to-digital signal converter, converting the analog image signal from the analog format into the digital format to generate the first digital image signal; and
   a parallel-to-serial signal converter, converting the first digital image signal from a parallel format into a serial format.

6. The image sensing device as claimed in claim 1, wherein each of the first image processing apparatuses comprises:
   a color interpolator, coupled to the corresponding signal converter and perform color interpolation on the first digital image signal in the serial format to generate a first full-color image signal; and
   a video encoder, coupled to the color interpolator and converting the first full-color image signal into the video signal in the specific video format.

7. The image sensing device as claimed in claim 1, wherein the specific video format is a Composite Video Broadcast Signal (CVBS) format.

8. The image sensing device as claimed in claim 1, wherein the image sensing array further comprises two or more second pixel capturing areas partitioned in the image sensing array, each of the second pixel capturing areas is compliant with the resolution of the standard-definition television format, and
   the image sensing device further comprises:
   a plurality of second signal converters, wherein each of the second signal converters is coupled to a corresponding second pixel capturing area of the second pixel capturing areas, receives an analog image signal from the corresponding second pixel capturing area, converts the analog image signal in the analog format into a second digital image signal in the digital format, and converts the second digital image signal from the parallel format into the serial format; and
   a plurality of second image processing apparatuses, wherein each of the second image processing apparatuses is coupled to a corresponding second signal converter of the second signal converters and converts the second digital image signal in the serial format of the corresponding second signal converter into a second video signal compliant with the specific video format.

9. The image sensing device as claimed in claim 1, wherein the image sensing device comprises a single image sensing array, the number of the first pixel capturing areas partitioned in the image sensing array is 2×N, and the number of the first signal converters and the number of the first image processing apparatuses are 2×N, wherein N is a positive integer.

10. The image sensing device as claimed in claim 1, wherein the image sensing device comprises a single image sensing array, the number of the first pixel capturing areas partitioned in the image sensing array is M×N, and the number of the first signal converters and the number of the first image processing apparatuses are M×N, wherein M is a multiple of 2, and M and N are positive integers.

11. An image sensing method, comprising:
capturing an image by an image sensing array, wherein the image sensing array is partitioned into two or more pixel capturing areas, and each of the pixel capturing areas is compliant with a resolution of a standard-definition television format;
receiving analog image signals from corresponding pixel capturing areas of the image capturing areas, converting the analog image signals in an analog format into digital image signals in a digital format, and converting the digital image signals from a parallel format into a serial format by a plurality of signal converters; and
converting the digital image signals in the serial format of corresponding signal converters of the signal converters into video signals compliant with a specific video format by a plurality of image processing apparatuses, wherein each image sensing array captures an image based on a temporal sequence compliant with the standard-definition television format.

12. The image sensing method as claimed in claim 11, wherein the image sensing array, the signal converters, and the image processing apparatuses are integrated in an integrated circuit.

13. The image sensing method as claimed in claim 11, wherein the image sensing array and the signal converters are disposed and integrated in a first integrated circuit, and the image processing apparatuses are disposed in a second integrated circuit.

14. The image sensing method as claimed in claim 11, further comprising:
integrating the video signals generated by the image processing apparatuses into a single complete video.

15. The image sensing method as claimed in claim 11, wherein the specific video format is a Composite Video Broadcast Signal (CVBS) format.

16. The image sensing method as claimed in claim 11, wherein the image is captured by a single image sensing array, the number of the pixel capturing areas partitioned in the image sensing array is 2×N, and the number of the signal converters and the number of the image processing apparatuses are 2×N, wherein N is a positive integer.

17. The image sensing method as claimed in claim 11, wherein the image is captured by a single image sensing array, the number of the pixel capturing areas partitioned in the image sensing array is M×N, and the number of the signal converters and the number of the image processing apparatuses are M×N, wherein M is a multiple of 2, and M and N are positive integers.

* * * * *